(12) United States Patent
Inaba et al.

(10) Patent No.: US 7,838,952 B2
(45) Date of Patent: Nov. 23, 2010

(54) MEMS DEVICE AND FABRICATION METHOD THEREOF

(75) Inventors: Shogo Inaba, Shiojiri (JP); Akira Sato, Fujimi (JP); Toru Watanabe, Suwa (JP); Takeshi Mori, Suwa (JP)

(73) Assignee: Seiko Epson Corporation (JP)

( * ) Notice: Subject to any disclaimer, the term of this patent is extended or adjusted under 35 U.S.C. 154(b) by 184 days.

(21) Appl. No.: 11/872,351

(22) Filed: Oct. 15, 2007

(65) Prior Publication Data

US 2008/0093684 A1    Apr. 24, 2008

(30) Foreign Application Priority Data

Oct. 20, 2006    (JP) .............................. 2006-286035
May 17, 2007    (JP) .............................. 2007-131316

(51) Int. Cl.
*H01L 49/00*    (2006.01)
(52) U.S. Cl. ............................... 257/415; 257/E29.324
(58) Field of Classification Search ................ 257/415, 257/E29.324
See application file for complete search history.

(56) References Cited

U.S. PATENT DOCUMENTS

| 5,717,279 | A | 2/1998 | Imura |
| 6,174,820 | B1 * | 1/2001 | Habermehl et al. .......... 438/745 |
| 7,344,907 | B2 * | 3/2008 | Colgan et al. ................. 438/51 |
| 7,352,040 | B2 * | 4/2008 | Partridge et al. ............ 257/419 |
| 2001/0001075 | A1 * | 5/2001 | Ngo et al. ................... 438/257 |
| 2003/0042561 | A1 * | 3/2003 | Funaki ........................ 257/415 |
| 2006/0180882 | A1 | 8/2006 | Sato et al. |
| 2006/0226934 | A1 * | 10/2006 | Ohguro ........................ 335/78 |
| 2007/0069342 | A1 * | 3/2007 | Inaba .......................... 257/666 |
| 2008/0128841 | A1 * | 6/2008 | Fujimori et al. ............. 257/418 |
| 2009/0108381 | A1 * | 4/2009 | Buchwalter et al. ......... 257/415 |
| 2009/0194827 | A1 * | 8/2009 | Ogino et al. ................ 257/415 |

FOREIGN PATENT DOCUMENTS

| JP | 06-005622 | 1/1994 |
| JP | 08-236013 | 9/1996 |
| JP | 10-506196 | 6/1998 |
| JP | 10-335675 | 12/1998 |
| JP | 11-284068 | 10/1999 |
| JP | 11-284204 | 10/1999 |
| JP | 2001-076599 | 3/2001 |
| JP | 2001-264677 | 9/2001 |
| JP | 2004-221853 | 8/2004 |
| JP | 2006-247815 | 9/2006 |
| JP | 2006-255879 | 9/2006 |
| WO | WO 96/14660 | 5/1996 |

* cited by examiner

*Primary Examiner*—Allan R Wilson
(74) *Attorney, Agent, or Firm*—Harness, Dickey & Pierce, P.L.C.

(57) ABSTRACT

A micro electro mechanical system (MEMS) device includes: a fixed electrode made of silicon and provided above a semiconductor substrate; a movable electrode made of silicon and arranged in a mechanically movable manner by having a gap from the semiconductor substrate; and a wiring layered part that is provided around the movable electrode, covers a portion of the fixed electrode and includes wiring. One of the fixed electrode and the movable electrode is implanted with an impurity ion and at least a part of the portion of the fixed electrode covered by the wiring layered part is silicidized.

14 Claims, 6 Drawing Sheets

MEMS DEVICE AND FABRICATION METHOD THEREOF

RELATED APPLICATIONS

This application claims priority to Japanese Patent Application Nos. 2006-286035 filed Oct. 20, 2006 and 2007-131316 filed May 17, 2007 which are hereby expressly incorporated by reference herein in their entirety.

BACKGROUND

1. Technical Field

The present invention relates to micro electro mechanical system (MEMS) devices equipped with structures such as movable and fixed electrodes on a silicon substrate using semiconductor fabrication processes and to fabrication methods of such MEMS devices.

2. Related Art

Development in microfabrication technology raises interest in electromechanical devices, or so-called MEMS devices, such as resonators, filters, sensors, and motors. Each of these devices has minute structures composed of a movable electrode and a fixed electrode fabricated by semiconductor fabrication processes. Because semiconductor fabrication processes are used in the fabrication of the MEMS device, a complex device combining the MEMS device with, for example, a complementary metal oxide semiconductor (CMOS) can be produced. Therefore, the MEMS device is also required to meet expectations to respond to today's growing demands for miniaturization and higher performance of electronic apparatuses.

Due to the demands for miniaturization and higher performance of electronic apparatuses, MEMS devices are expected to perform with a higher precision current value control at an electrically higher speed. Therefore, it is requested that the structures and wiring making up the circuitry of the MEMS device have lower resistance. For example, a large insertion loss of a MEMS device, such as a radio frequency MEMS (RF-MEMS) that operates at a high frequency band, directly affects the characteristics of the MEMS device. Therefore, it is necessary to keep the resistance value of the entire circuitry of the MEMS device as low as possible.

One exemplary method for fabricating the MEMS device is as follows. First, a fixed electrode and a movable electrode with a portion thereof being on a sacrificial layer are provided on a semiconductor substrate made of, for example, silicon (Si). Then, a wiring layered part containing wiring is provided on the fixed electrode and the movable electrode. Then, a portion of the wiring layered part and a portion of the sacrificial layer are removed by etching (release-etching) so as to release the movable electrode, thereby providing the movable electrode in a mechanically movable state.

The wiring in the circuitry of the MEMS device is generally provided, as in common semiconductor fabrication, by depositing metal such as aluminum (Al) through sputtering, chemical vapor deposition (CVD), or vacuum vapor deposition, and then by patterning. The wiring therefore has a low resistance. In contrast, the structures of the MEMS device including the movable electrode and the fixed electrode need be treated in order to lower the resistance of silicon, which is a semiconductor, after the silicon deposition and patterning. A known treatment method to lower the resistance of the structures made of silicon is to implant impurity ions such as phosphorous ions (e.g., $^{31}P^+$) into the silicon film to provide a diffusion layer (e.g., see JP-A-2004-221853).

Another method to further reduce the resistance of the structures is depicted in, for example, JP-A-2004-221853 or JP-A-2001-264677, in which a metal is deposited on a silicon film through sputtering, CVD, or vacuum vapor deposition, followed by annealing at a high temperature so as to silicidize, that is, diffuse and alloy the silicon abutting on titanium which is the metal. The portion silicidized with titanium (TiSi), for example, has a specific resistance of approximately $10^{-5}$ $\Omega$cm, and this is about one hundredth of that of a diffusion layer produced using impurity ion implantation.

As described above, by the method of producing a diffusion layer using impurity ion implantation into the structure made of silicon, it is difficult to reduce the resistance value of the structures to a resistance value required for the MEMS device to perform at a high frequency band. In contrast, the method of silicidizing the silicon structure is effective in drastically lowering the resistance of the structures. However, depending on the type of metal for silicidization, the silicide part may dissolve in the etchant when etching and removing the portion of the wiring layered part and the portion of the sacrificial layer to release the movable electrode. If the silicide part is dissolved, the resistance value may increase, and the thinned structures may lose its mechanical strength. As a consequence, the electrical and mechanical characteristics of the MEMS device may fluctuate, and the desired characteristics may not be attained.

SUMMARY

An advantage of an aspect of the invention is to provide a high-performance micro electro mechanical system (MEMS) device by reducing an electrical resistance value of MEMS structures while maintaining their mechanical characteristics, and a method for fabricating the MEMS device.

According to a first aspect, a MEMS device includes: a fixed electrode made of silicon and provided above a semiconductor substrate; a movable electrode made of silicon and arranged in a mechanically movable manner by having a gap from the semiconductor substrate; and a wiring layered part that is provided around the movable electrode, covers a portion of the fixed electrode and includes wiring. The fixed electrode or the movable electrode is implanted with an impurity ion and at least a part of the portion of the fixed electrode covered by the wiring layered part is silicidized.

In this case, the movable electrode or the fixed electrode is made to have a lower resistance by being implanted with impurity ions. In particular, in the process of producing the movable electrode and the fixed electrode of the MEMS device, the lower resistance is obtained at a portion exposed to a release etchant used to release the movable electrode by release-etching a portion of the wiring layered part, that is, a portion that is not easily silicidized. Accordingly, the resistance value of the entire circuitry of the MEMS device may be reduced.

Also, in the MEMS device having such a composition, at least a part of the portion of the fixed electrode that is covered by the wiring layered part is silicidized. That is, when releasing the movable electrode, the portion not in contact with the release etchant is silicidized. As a result, even if a metal is used as the silicidizing metal, the silicide part of the fixed electrode does not dissolve in, for example, a hydrofluoric etchant, and the fixed electrode may have a low resistance. The silicidized silicon may even have a specific resistance of as low as one hundredth of what may be obtained by merely implanting the impurity ions such as phosphorous ions, and the resistance value may be drastically reduced.

Accordingly, the resistance value of the entire circuitry of the MEMS device having such a composition may be drastically reduced, and it is possible to provide the MEMS device with less insertion loss and improved passband characteristics when in operation and with excellent operating characteristics applicable to high-frequency devices.

In the MEMS device, either a portion of the fixed electrode arranged outside the wiring layered part or the movable electrode or both thereof may be silicidized.

The silicidizing metal used for the silicidization may be tungsten (W) or molybdenum (Mo).

With such a composition, it is possible that substantially the entire structures, or portions thereof, of the fixed electrode and the movable electrode constituting the structures of the MEMS device that are arranged outside the wiring layered part may include the silicide parts produced by silicidizing. Accordingly, the entire circuitry of the MEMS device may have a markedly lower resistance.

In this case, if tungsten or molybdenum is used as the silicidizing metal, the silicidized part is not readily dissolved in, for example, a hydrofluoric release etchant. Therefore, it is possible to stably silicidize the portions of the structures that come in contact with the release etchant at the time of releasing the fixed electrode in the process of MEMS device fabrication and, therefore, to stably provide the MEMS device with a further reduced resistance value.

According to a method for fabricating a MEMS device of a second aspect, the MEMS device includes: a fixed electrode made of silicon and provided above a semiconductor substrate; a movable electrode made of silicon and arranged in a mechanically movable manner by having a gap from the semiconductor substrate; and a wiring layered part that is provided around the movable electrode, covers a portion of the fixed electrode and includes wiring. The method includes: providing the fixed electrode on the semiconductor substrate, providing the movable electrode in a manner that a portion thereof is on a sacrificial layer, providing the wiring layered part above the fixed electrode and the movable electrode, etching and removing a portion of the wiring layered part and a portion of the sacrificial layer. Either the step of providing the fixed electrode or the step of providing the movable electrode or both of these steps includes implanting an impurity ion into the fixed electrode or the movable electrode, and the step of providing the fixed electrode includes silicidizing at least a part of the portion of the fixed electrode covered by the wiring layered part.

In this case, because the movable electrode and the fixed electrode are implanted with impurity ions, the resistance of these electrodes may be reduced. In particular, in the process of releasing the movable electrode, it is possible to reduce the resistance at the portion that is not readily silicidized as it comes in contact with the release etchant. Accordingly, it is possible to reduce the resistance of the entire circuitry of the MEMS device and to provide the MEMS device with excellent operating characteristics.

Also, when releasing the movable electrode, because the portion not in contact with the release etchant is silicidized, the fixed electrode does not dissolve in the release etchant even if a metal is used as the silicidizing metal. Accordingly, it is possible to prevent an increase in the resistance value of the fixed electrode caused by dissolution of the silicide part and to prevent a decrease in the mechanical strength of the fixed electrode. Therefore, it is possible to stably produce the silicidized fixed electrode, to drastically reduce the resistance value of the entire circuitry of the MEMS device, and thereby to provide the MEMS device with excellent operating characteristics.

The method for fabricating the MEMS device may include silicidizing either a portion of the fixed electrode arranged outside the wiring layered part or the movable electrode or both in either the step of providing the fixed electrode or the step of providing the movable electrode or both.

The silicidizing metal used for the silicidization may be tungsten (W) or molybdenum (Mo).

In this case, it is possible to provide the silicide parts by silicidizing substantially all the structures of the MEMS device such as the fixed electrode and the movable electrode. As a result, the entire circuitry of the MEMS device may have a markedly lower resistance.

Further, tungsten or molybdenum used as the silicidizing metal is not easily dissolved in the hydrofluoric release etchant. Therefore, it is possible to stably silicidize the portion of the structure that comes in contact with the release etchant in the process of releasing the movable electrode, and thereby to stably provide the MEMS device with a further reduced resistance value.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the invention will now be described.

First Embodiment

Figure 1A:
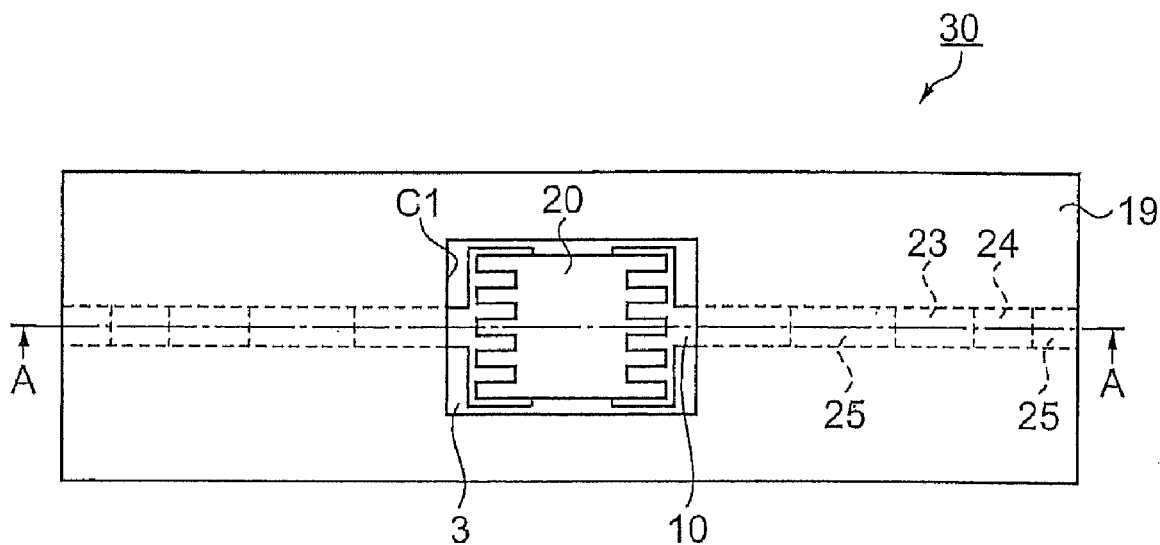
FIG. 1A is a plan diagram to explain the schematic structure of a micro electro mechanical system (MEMS) device according to a first embodiment of the invention.
Figure 1B:
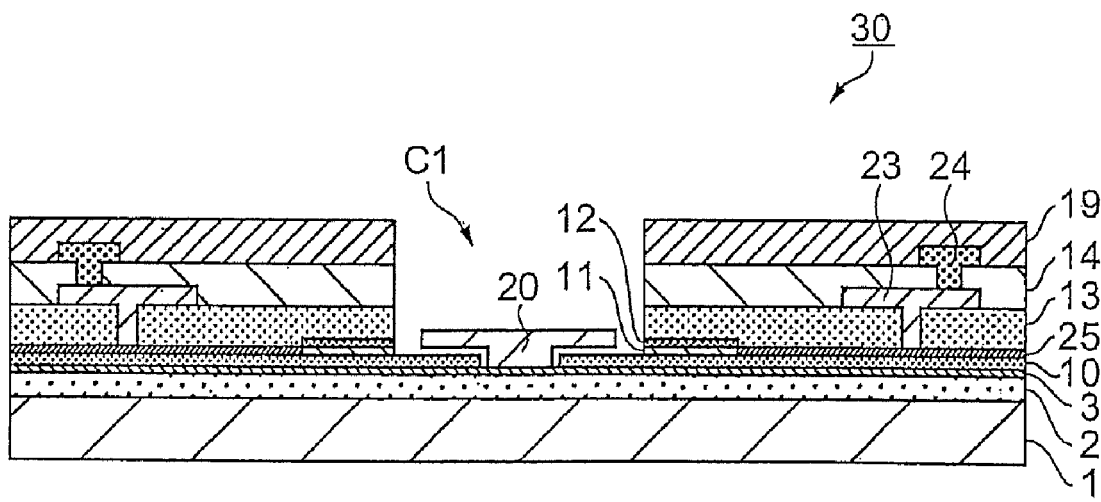
FIG. 1B is a sectional diagram of FIG. 1A taken on a line A-A.

First, one example of a micro-electromechanical system (MEMS) device will be described in accordance with the drawings. FIG. 1A is a plan diagram showing a composition of the MEMS device of the first embodiment of the invention. FIG. 1B is a sectional diagram of FIG. 1A taken on a line A-A.

Referring to FIGS. 1A and 1B, a MEMS device 30 includes: a silicon substrate 1, a fixed electrode 10 fixed above the silicon substrate 1, and a wiring layered part that is layered above a portion of the fixed electrode 10 and composed of a first interlayer insulating film 13, a first wiring layer 23, a second interlayer insulating film 14, a second wiring layer 24, and a protection film 19. Also, a movable electrode 20 is provided in a movable state in an opening C1 formed in the approximate center of the wiring layered part. A silicide part 25 is provided at a portion of the fixed electrode 10 covered by the wiring layered part by silicidizing the surface of the portion.

Layered on the silicon substrate 1 are an insulating film 2 that is a silicon oxide film ($SiO_2$, e.g., a thermally-oxidized film) and a nitride film 3 made of, for example, silicon nitride (SiN), in this order. Disposed on the nitride film 3 is the fixed electrode 10 which is produced by depositing a polycrystalline silicon film by a process such as chemical vapor deposition (CVD) and then patterning. The fixed electrode 10 is produced by implanting impurity ions such as phosphorous ions into the polycrystalline silicon film after the deposition of the polycrystalline silicon film and before patterning. The fixed electrode 10 contains: a portion exposed at the opening C1 formed in the wiring layered part which will be described hereafter, a portion including a sacrificial layer 11 and an interlayer film 12 layered in this order and covering a predetermined area next to the opening C1, and the silicide part 25 that is silicidized with a silicidizing metal.

As described, the fixed electrode 10 made of polycrystalline silicon is subjected to the impurity ion implantation and includes the silicide part 25 produced by silicidization of the portion of the fixed electrode 10. Accordingly, it is possible to reduce a sheet resistance value of the fixed electrode 10 to about one hundredth of what it is when only impurity-ion implantation is conducted to the polycrystalline silicon. As a result, the MEMS device 30 has less insertion loss and improved passband characteristics when in operation, thereby exhibiting excellent operating characteristics that are applicable to high-frequency devices.

On the silicide part 25 of the fixed electrode 10 and on the portion where the sacrificial layer 11 and the interlayer film 12 are layered in series, the wiring layered part including, in this order, the first interlayer insulating film 13, the first wiring layer 23, the second interlayer insulating film 14, and the second wiring layer 24 is disposed. A portion of the first interlayer insulating film 13 is patterned, thereby conductively connecting the fixed electrode 10 to the first wiring layer 23. Also, a portion of the second interlayer insulating film 14 is patterned, thereby conductively connecting the first wiring layer 23 to the second wiring layer 24. The protecting film (passivation film) 19 is layered on the second wiring layer 24.

In this embodiment, the wiring layered part has two wiring layers, namely the first and second wiring layers 23 and 24, and the second interlayer insulating film 14 is interposed therebetween. However, there may be one or more wiring layers in the wiring layered part.

The opening C1 has the shape of a cylindrical or rectangular recess and is provided in the approximate center of the wiring layered part including, in this order, the sacrificial layer 11, the interlayer film 12, the first interlayer insulating film 13, the first wiring layer 23, the second interlayer insulating film 14, the second wiring layer 24, and the protecting film 19. Provided at the bottom of the recessed opening C1 is the movable electrode 20 formed by depositing the polycrystalline silicon film by, for example, CVD and then patterning. A part of the movable electrode 20 is held on the nitride film 3, and the movable electrode 20 is in a movable state having a predetermined gap from the nitride film 3 and the fixed electrode 10 created as a result of removing the sacrificial layer 11 at the lower part of the movable electrode 20. Also, after deposition of the polycrystalline silicon film and before patterning the film, impurity ions such as phosphorous ions are implanted in the movable electrode 20.

One exemplary operation of the MEMS device 30 having the above composition will now be described. In the present embodiment, an excitation electrode is on one of the two sides of the fixed electrode 10 interposing the movable electrode 20, and a detection electrode is on the other side. An appropriate series bias voltage is to be supplied to the movable electrode 20.

When an excitation voltage is injected to the excitation electrode side of the fixed electrode 10 of the MEMS device 30, a potential difference is generated between the fixed electrode 10 and the movable electrode 20, and electrical charge is accumulated. Depending on changes in the potential with time or changes in the accumulating charge with time, an alternating current flows between the excitation electrode side of the fixed electrode 10 and the movable electrode 20, as in the case with a common capacitor. The same is true between the detection electrode side of the fixed electrode 10 and the movable electrode 20. Thus, an alternating current equivalent to a capacitance generated by two capacitors connected in series flows in the MEMS device 30 as a whole.

In contrast, the movable electrode 20 has an inherent resonant frequency at a specified frequency and flexes in a thickness direction at the specified frequency. In this situation, a shift in the capacitance is generated between the excitation electrode side of the fixed electrode 10 and the detection electrode side of the movable electrode 20, and a charge equivalent to a voltage is accumulated in the capacitor provided between the structures. However, when the capacitance fluctuates, the charge shifts so as to satisfy the amount Q=CV accumulated in the capacitor. As a result, at the inherent resonance frequency of the movable electrode 20, a current flows along with the shift in capacitance. An output current from the movable electrode 20 is detected by the detection electrode of the fixed electrode 10.

Second Embodiment

A method for fabricating the MEMS device 30 of the first embodiment will now be explained. FIGS. 2A to 2C, 3A to 3C, and 4A to 4D are schematic sectional diagrams explaining processes for fabricating the MEMS device 30. FIGS. 2A to 2C, 3A to 3C, and 4A to 4D show a section of the MEMS device 30 taken at the same position as in FIG. 1B.

Figure 2A:
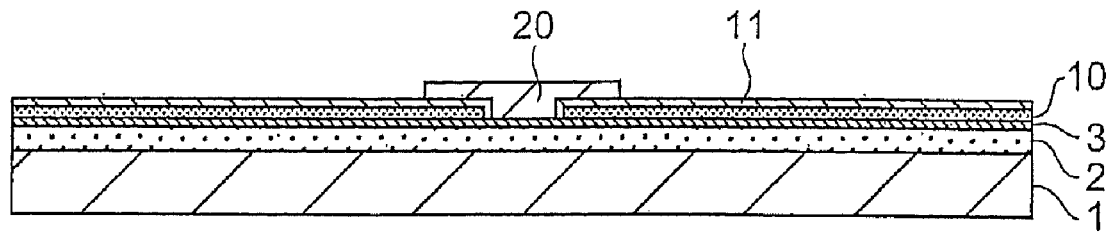
FIGS. 2A through 2C are schematic sectional diagrams explaining a MEMS device fabrication method according to a second embodiment of the invention.

To fabricate the MEMS device 30, semiconductor fabrication processes are used. Referring to FIG. 2A, the surface of the silicon substrate 1 is, for example, thermally oxidized to provide the insulating film 2 made of silicon oxide ($SiO_2$). On the insulating film 2, the nitride film 3 composed of, for example, silicon nitride (SiN) is deposited by a process such as CVD or sputtering. This nitride film 3 becomes a base layer that will act as an etching stop layer used when conducting release etching as will be described hereafter.

Then, a polycrystalline silicon film is deposited by, for example, CVD on the nitride film 3 and, after being implanted with impurity ions such as phosphorous ions (e.g., $^{31}P^+$), is patterned by a process such as photolithography to provide the fixed electrode 10.

Next, the sacrificial layer 11 made of an oxide film such as silicon oxide is provided on the fixed electrode 10 through, for example, sputtering. Then, on the sacrificial layer 11, a polycrystalline silicon film is deposited by CVD, sputtering, vacuum vapor deposition, or the like. After being implanted with impurity ions such as phosphorous ions, the polycrystalline silicon film is patterned by, for example, photolithography to provide the movable electrode 20.

Figure 2B:
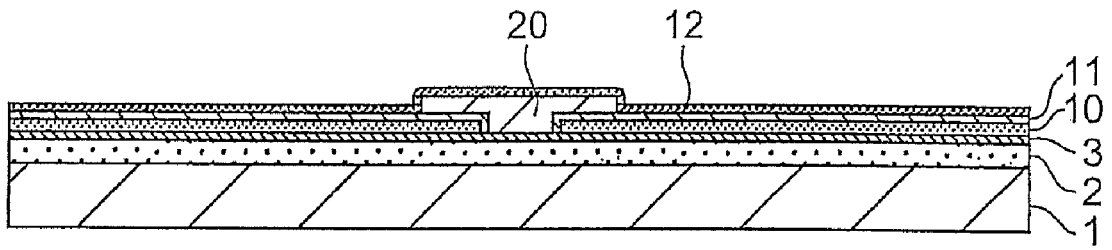
Figure 2C:
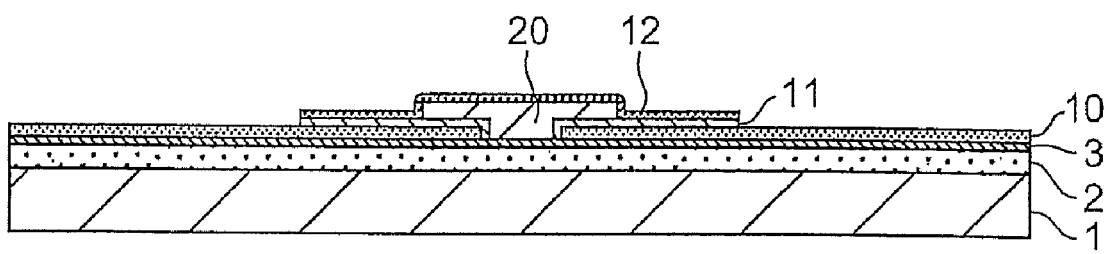

Thereafter, referring to FIG. 2B, the interlayer film 12 made of an oxide film such as silicon oxide is deposited through a process such as CVD or sputtering. Then, referring to FIG. 2C, a predetermined region of the interlayer film 12 and the sacrificial layer 11 is removed by, for example, photolithography to expose a portion of the polycrystalline silicon of the fixed electrode 10. The predetermined region of the fixed electrode 10 exposed in this process is a region to be silicidized in a process as described hereafter.

Figure 3A:
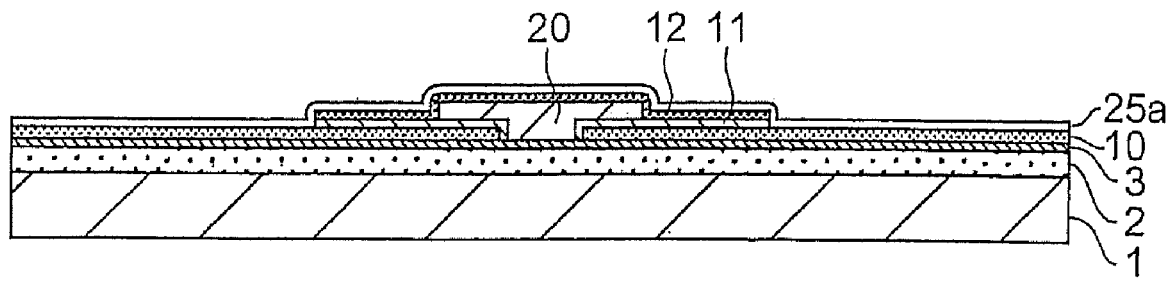
FIGS. 3A through 3C are schematic sectional diagrams explaining the MEMS device fabrication method according to the second embodiment of the invention.

Then, referring to FIG. 3A, a silicidizing metal layer 25a that is used to silicidize the portion of the fixed electrode 10 is formed by a process such as vacuum vapor deposition, sputtering, or CVD. In this step, the silicidizing metal layer 25a is disposed directly on the exposed portion of the polycrystalline silicon of the fixed electrode 10 and on the interlayer film 12. A metal used for the silicidizing metal layer 25a may be, for example, titanium (Ti), tungsten (W), molybdenum (Mo), cobalt (Co), platinum (Pt), or palladium (Pd).

Figure 3B:
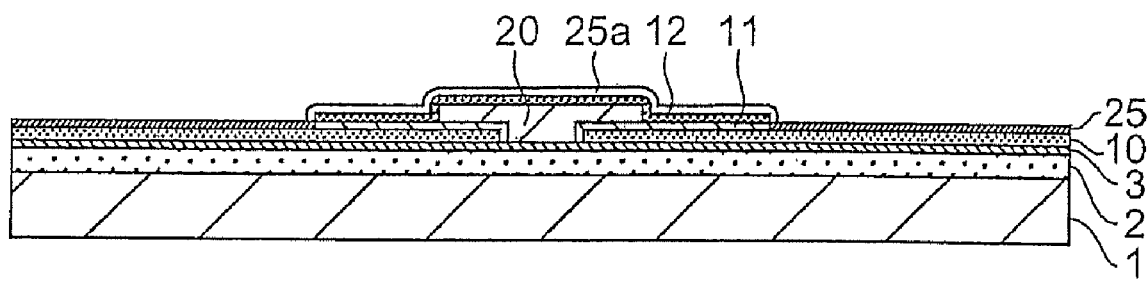

Thereafter, annealing, for example lamp annealing, is conducted for a predetermined period of time at a predetermined temperature. As a result, the exposed portion of the polycrystalline silicon of the fixed electrode 10 is silicidized with the silicidizing metal layer 25a, thereby producing the silicide part 25 (FIG. 3B).

By forming the silicide part 25 by silicidizing the portion of the fixed electrode 10, as described, the sheet resistance of the silicide part 25 can be further reduced. Because the sheet resistance in the entire MEMS device is markedly reduced as a consequence, the MEMS device 30 has less insertion loss and improved passband characteristics when in operation, thereby exhibiting excellent operating characteristics.

Figure 3C:
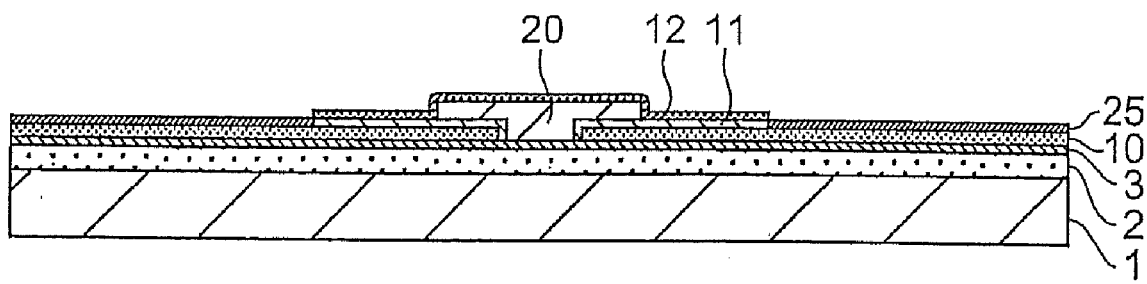

Then, referring to FIG. 3C, an unsilicidized portion of the silicidizing metal layer 25a is removed by etching using, for example, an aqueous solution of ammonia ($NH_4$) and hydrogen peroxide ($H_2O_2$). The etchant to be used is not limited to the aqueous solution of ammonia and hydrogen peroxide but may be any etchant having a selection ratio at which only the silicidizing metal layer 25a is etched and the silicide part 25 is left unetched.

Figure 4A:
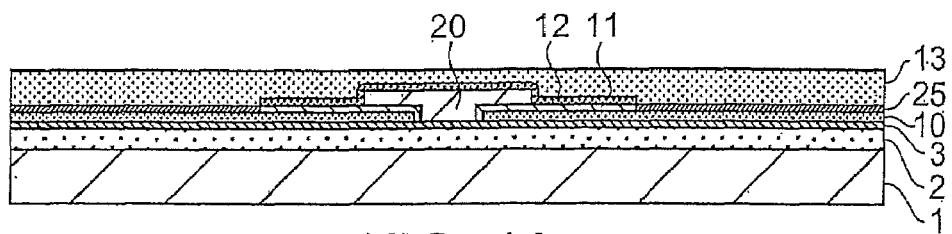
FIGS. 4A through 4D are schematic sectional diagrams explaining the MEMS device fabrication method according to the second embodiment of the invention.

Next, with reference to FIG. 4A, the first interlayer insulating film 13 is formed by, for example, sputtering. At this point, a base layer used to deposit the first interlayer insulating film 13 thereon has an uneven surface. However, the upper surface of the first interlayer insulating film 13 may be planarized so that the wiring layer is easily fabricated thereon in a later process. For this reason, boron phosphorous silicon glass (BPSG) or phosphorous silicon glass (PSG) may be used for the film 13 so that it can be planarized by a reflow process. Additionally, to planarize the upper surface of the interlayer insulating film, spin on glass (SOG) obtained by spin-coating a liquid insulating glass material may be used, or silicon oxide or the like may be sputtered and then chemically and mechanically polished by a planarizing technique such as chemical mechanical polishing (CMP).

Figure 4B:
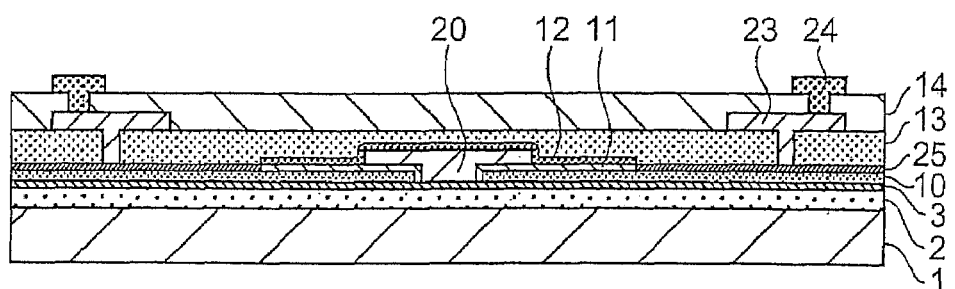

Thereafter, referring to FIG. 4B, the first wiring layer 23, the second interlayer insulating film 14, and the second wiring layer 24 are laminated in this order on the first interlayer insulating film 13 through processes such as sputtering or CVD, photolithography, and patterning. The first and second wiring layers 23 and 24 draw wires from the fixed electrode 10 having the silicide part 25 on the surface thereof. In this embodiment, there are two wiring layers including the first and second wiring layers. However, there may be a single wiring layer or there may be three or more wiring layers if desired.

Figure 4C:
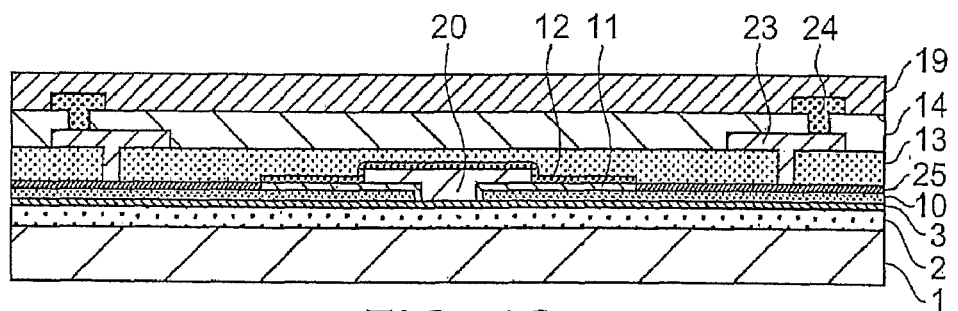

Then, referring to FIG. 4C, a protection film (passivation film) 19 made of, for example, silicon nitride is formed on the second wiring layer 24. The protection film 19 may be formed by a process such as CVD or sputtering. If the protection film 19 is made of silicon nitride ($Si_3N_4$), it may be produced using, for example, plasma CVD.

Figure 4D:
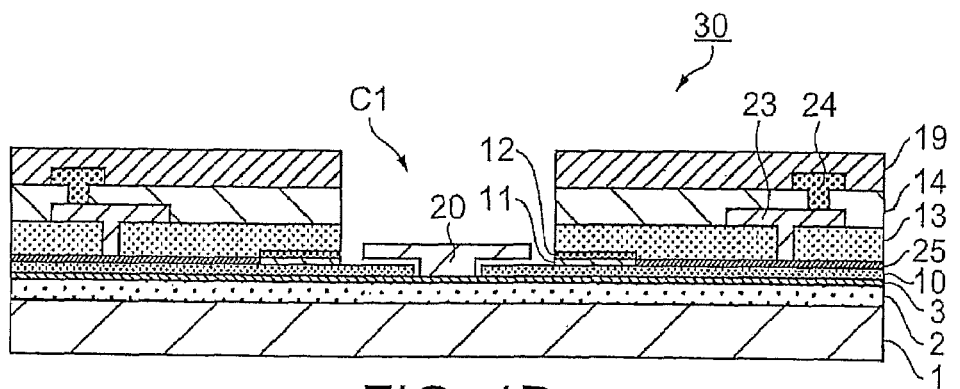

Thereafter, the movable electrode 20 is release-etched. The release etching is conducted using, for example, a hydrofluoric (HF) etchant having a selection ratio at which only the layers made of, for example, single-crystalline silicon oxide can be etched and at which the fixed electrode 10 and the movable electrode 20 made of polycrystalline silicon and the nitride film 3 made of silicon nitride are not etched. First, a photoresist pattern for forming the opening C1 is provided. Then, using the photoresist pattern as an etching mask, wet etching is performed using the hydrofluoric etchant. Referring to FIG. 4D, the opening C1 is produced by removing: the protection film 19, the second interlayer insulating film 14, the first interlayer insulating film 13, the interlayer film 12 covering the upper surface and side surface of the movable electrode 20, and the sacrificial layer 11 at the lower portion of the movable electrode 20. In this release etching, etching in the thickness direction is stopped by the nitride film 3 that acts as the etching stop layer, and the fixed electrode 10 is left unetched. Also, by the removal of the sacrificial layer 11 at the lower portion of the movable electrode 20, the movable electrode 20 becomes movable by forming a predetermined gap from the nitride film 3 and the fixed electrode 10.

Note that, depending on the type of the silicidizing metal, the silicide part may dissolve in the hydrofluoric release etchant. As a consequence, the sheet resistance may in fact increase, and the thinned structures may lose their mechanical strength, thereby causing fluctuation in the mechanical characteristics. In the fabrication method of this embodiment, however, because the un-release-etched region of the fixed electrode 10 can be silicidized, the silicide part 25 is not dissolved by the release etchant. Also, it is possible to select a metal for the silicidizing metal layer 25a from a wide range without having to consider its resistivity to the release etchant, and to produce the effect of silicidizing the MEMS structures of the MEMS device 30 such as the fixed electrode 10 and the movable electrode 20.

The release etching may be conducted in multiple steps including a dry etching process. For example, through the photoresist pattern as described above, the protection film 19, the second interlayer insulating film 14, and the first interlayer insulating film 13 are first dry-etched to a predetermined depth by a reactive ion etching (RIE) process using a reactive gas such as $CHF_3$. Then, the release etching is performed using the hydrofluoric etchant to release the movable electrode 20. According to this method, dry etching by RIE exhibits strong anisotropy, and etching, or so-called undercut, of the protection film 19 directly below an end portion of the photoresist pattern does not easily occur. Thus, it is possible to proceed with the etching in a substantially vertical direction and, at the same time, to shorten the time required for release etching.

After the release etching, the photoresist pattern is peeled off, and the series of MEMS device fabrication processes is completed.

As described hereinbefore, in the fabrication method of this embodiment, the MEMS device 30 equipped with the fixed electrode 10 having the silicide part 25 is produced by the semiconductor fabrication processes.

Accordingly, it is possible to relatively easily realize fabrication of the composite MEMS device on the silicon substrate 1 that includes the MEMS structures as well as a CMOS element such as an oscillation circuit, and thereby to fabricate the MEMS device 30 having multiple functions.

Third Embodiment

According to the MEMS device 30 of the first embodiment produced by the fabrication method of the second embodiment, the portion of the fixed electrode 10 that is unexposed to the release etchant when releasing the movable electrode 20 is silicidized to form the silicide part 25. In contrast, in the third embodiment, the silicide part is provided on a portion of the movable electrode and a portion of the fixed electrode that are exposed to the release etchant. The explanation thereof will follow with reference to a drawing.

Figure 5:
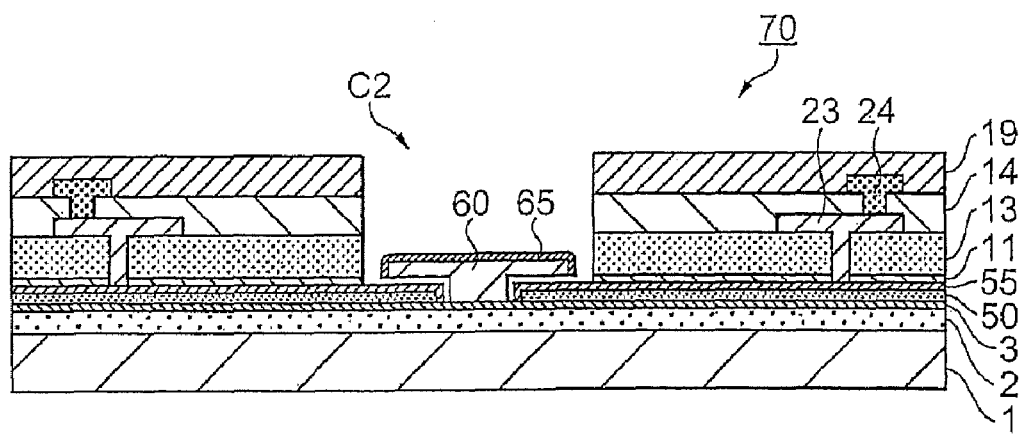
FIG. 5 is a schematic sectional diagram to explain the schematic structure of a MEMS device of a third embodiment of the invention.

FIG. 5 is a schematic sectional diagram to explain a MEMS device 70 of the third embodiment, the section thereof taken at the same position as in FIG. 1B in the first embodiment. The elements of the MEMS device 70 of the third embodiment that are identical to those of the MEMS device 30 are designated with the same reference numbers, and descriptions thereof will not be repeated.

With reference to FIG. 5, the MEMS device 70 includes: the silicon substrate 1, a fixed electrode 50 fixed on the silicon substrate 1, the first interlayer insulating film 13 layered above the fixed electrode 50, the first wiring layer 23, the second interlayer insulating film 14, the second wiring layer 24, and the protection film 19. Also, a movable electrode 60 is provided in a movable state in an opening C2 formed in the approximate center of the wiring layered part. The surface of the fixed electrode 50 is silicidized to provide a silicide part 55. The surface of the movable electrode 60 is silicidized to provide a silicide part 65.

Layered on the silicon substrate 1 are the insulating film 2 and the nitride film 3, in this order. On the nitride film 3, the fixed electrode 50 is formed by ion-implanting impurity ions to the polycrystalline silicon film and then by patterning. The surface of the fixed electrode 50 includes the silicide part 55 that is silicidized with a silicidizing metal made of a metal having a high melting point. The metal having a high melting point may be tungsten or molybdenum which are not easily dissolved particularly in the hydrofluoric etchant used to release-etch the movable electrode 60.

Because the fixed electrode 50 includes the silicide part 55 provided by implanting impurity ions into the polycrystalline silicon and then silicidizing the surface thereof, as described, the sheet resistance value is drastically reduced. As a result, an effect is produced in that the insertion loss is further reduced and the passband characteristics are further improved when operating the MEMS device 70.

The sacrificial layer 11 is layered on a portion of the silicide part 55 of the fixed electrode 50. Provided on the sacrificial layer 11 is the wiring layered part layering, in this order, the first interlayer insulating film 13, the first wiring layer 23, the second interlayer insulating film 14, and the second wiring layer 24. The protection film (passivation film) 19 is layered on the wiring layered part.

In the approximate center of the wiring layered part, the opening C2 having the shape of a cylindrical or rectangular recess is provided. Provided at the bottom of the recess of the opening C2 is the movable electrode 60 held on the nitride film 3 in a movable state. The movable electrode 60 is made of polycrystalline silicon and formed by implanting impurity ions to the polycrystalline silicon film and then patterning. The surface of the movable electrode 60 includes the silicide part 65 that is silicidized with a silicidizing metal made of a metal having a high melting point, such as tungsten or molybdenum.

Because the movable electrode 60 is formed through impurity-ion implantation to obtain low resistance followed by patterning and is equipped with the silicide part 65 provided through silicidization of the electrode 60 with the metal having a high melting point, the sheet resistance is drastically reduced. Accordingly, because the movable electrode 60 and the fixed electrode 50 that are structures of the MEMS device 70 are silicidized, the resistance value of the entire circuitry of the MEMS device 70 is drastically reduced, the insertion loss is lowered, and the passband characteristics are improved. As a result, it is possible to provide the MEMS device 70 having excellent operating characteristics that are applicable to high-frequency devices.

Fourth Embodiment

A method for fabricating the MEMS device 70 of the above-described third embodiment will now be described in accordance with the drawings. The elements used in the method for fabricating the MEMS device 70 of the fourth embodiment that are identical to those of the MEMS device 30 of the second embodiment are designated with the same reference numbers, and descriptions thereof will not be repeated.

Figure 6A:
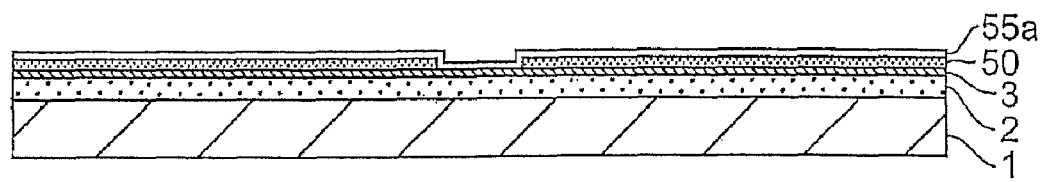
FIGS. 6A through 6C are schematic sectional diagrams explaining a MEMS device fabrication method of a fourth embodiment of the invention.

Referring to FIG. 6A, the nitride film 3 is deposited by a process such as CVD or sputtering on the insulating film 2 which is provided by, for example, thermally oxidizing the surface of the silicon substrate 1. Then, the fixed electrode 50 is fabricated by laminating a polycrystalline silicon film using, for example, CVD, implanting the impurity ions such as phosphorous to the film to reduce the resistance, and then patterning the resultant using, for example, photolithography. Then, a silicidizing metal layer 55a made of a metal having a high melting point is formed on the fixed electrode 50 by a process such as vacuum vapor deposition, sputtering, or CVD. In this embodiment, tungsten or molybdenum is used as the metal having the high melting point.

The silicide part of the fixed electrode 50 formed through silicidization using tungsten or molybdenum is insoluble particularly to the hydrofluoric etchant used for release etching in the process of releasing the movable electrode 60 as will be described hereafter. Therefore, it is possible to avoid a problem such that the resistance value increases due to dissolution of the portion of the silicide part exposed to the release etchant.

Figure 6B:
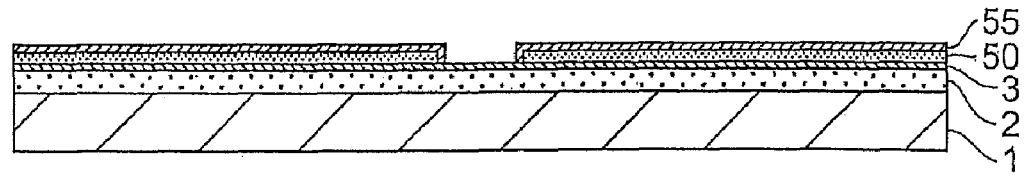

Next, referring to FIG. 6B, annealing is conducted by, for example, lamp annealing for a predetermined period of time at a predetermined temperature. As a result, a portion in contact with the polycrystalline silicon of the fixed electrode 50 is silicidized by the silicidizing metal layer 55a, thereby producing the silicide part 55. Then, an unreacted part of the silicidizing metal layer 55a on the nitride film 3 unsilicidized is removed using, for example, the aqueous solution of ammonia ($NH_4$) and hydrogen peroxide ($H_2O_2$).

By forming the silicide part 55 by silicidizing the portion of the fixed electrode 50, as described, the sheet resistance of the fixed electrode 50 is further reduced. As a result, the sheet resistance in the entire MEMS device is markedly reduced. The MEMS device 70 has therefore less insertion loss and improved passband characteristics when in operation, exhibiting excellent operating characteristics.

Figure 6C:
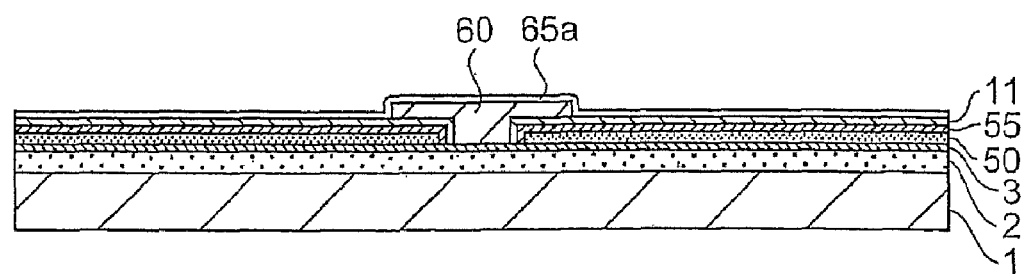

Thereafter, referring to FIG. 6C, the sacrificial layer 11 made of an oxide film such as silicon oxide is provided on the fixed electrode 50 through, for example, sputtering. Then, on the sacrificial layer 11, a polycrystalline silicon film is deposited by a process such as CVD, sputtering, or vacuum vapor deposition. After being implanted with impurity ions such as phosphorous ions to lower the resistance, the polycrystalline silicon film is patterned by a photolithography process or the like to fabricate the movable electrode 60. Then, a silicidizing metal layer 65a that is used to silicidize the movable electrode 60 is deposited using a process such as vacuum vapor deposition, sputtering, or CVD. In this embodiment, tungsten (W) or molybdenum (Mo) used for the silicidizing metal layer 55a is used as the metal having a high melting point.

The silicide part of the movable electrode 60 formed by silicidizing using tungsten or molybdenum is insoluble particularly to the hydrofluoric etchant that is used when releasing the movable electrode 60 as will be described hereafter. Therefore, it is possible to avoid such a problem that the resistance value increases due to dissolution of the portion of the silicide part exposed to the release etchant.

Figure 7A:
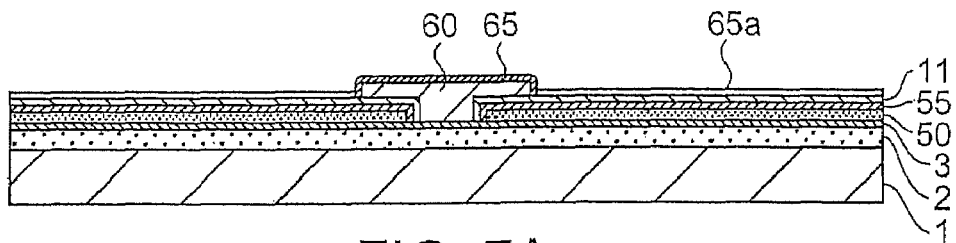
FIGS. 7A through 7C are schematic sectional diagrams explaining the MEMS device fabrication method of the fourth embodiment of the invention.

Next, referring to FIG. 7A, annealing of the polycrystalline silicon of the movable electrode 60 is conducted by, for example, lamp annealing for a predetermined period of time at a predetermined temperature. Consequently, the polycrystalline silicon is silicidized using the silicidizing metal layer 65a, thereby producing the silicide part 65.

By forming the silicide part 65 by silicidizing the movable electrode 60, as described, the sheet resistance of the movable electrode 60 is further reduced. Also, in this embodiment, because the fixed electrode 50 is silicidized to produce the silicide part 55 in the MEMS device 70, the sheet resistance of the entire MEMS device 70 is drastically reduced.

Figure 7B:
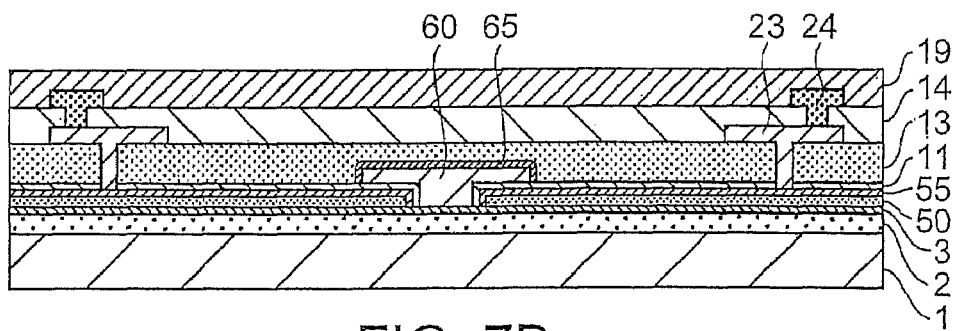

Thereafter, referring to FIG. 7B, the silicidizing metal layer 65a left unsilicidized (see FIG. 7A) is removed by etching using the aqueous solution of ammonia ($NH_4$) and hydrogen peroxide ($H_2O_2$). Then, the first interlayer insulating film 13 is formed by, for example, sputtering. Layered next on the first interlayer insulating film 13 is the wiring layered part including, in this order, the first wiring layer 23, the second interlayer insulating film 14, the second wiring layer 24 through processes such as sputtering or CVD, photolithography, and patterning. Thereafter, the protection film (passivation film) 19 made of, for example, silicon nitride is layered on the second wiring layer 24 by a process such as CVD or sputtering.

Figure 7C:
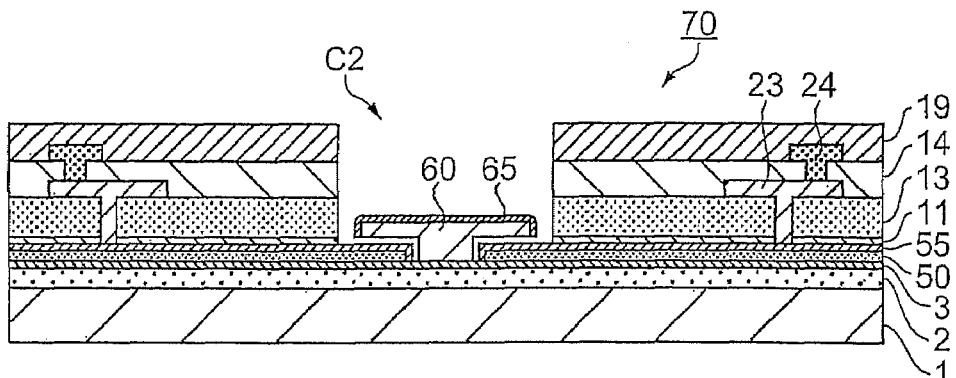

Then, with reference to FIG. 7C, the opening C2 is formed by etching and removing the protection film 19, the second interlayer insulating film 14, the first interlayer insulating film 13, and the sacrificial layer 11 at the lower portion of the movable electrode 60, using a release etchant such as a hydrofluoric release etchant.

Note that, depending on the type of the silicidizing metal, the silicide parts 55, 65 may dissolve in the hydrofluoric release etchant. The sheet resistance may in fact increase as a consequence, and the thinned structures may lose their mechanical strength, thereby causing fluctuation in the mechanical characteristics. In the fabrication method of this embodiment, however, the fixed electrode 50 and the movable electrode 60 are silicidized using tungsten or molybdenum that is insoluble to the release etchant such as hydrofluoric release etchant. Accordingly, the effect is produced in that the MEMS structures of the MEMS device 70 such as the fixed electrode 50 and the movable electrode 60 are silicidized without dissolving the silicide parts 55, 65 in the release etchant.

Modified Example

The MEMS device 30 as described in the first and second embodiments includes the silicide part 25 at the portion, which is covered by the wiring layered part, of the fixed electrode 10 and the portion is unexposed to the release etchant in the process of releasing the movable electrode 20.

Also, the MEMS device 70 as described in the third and fourth embodiments includes the silicide part 55 of the fixed electrode 50 and the silicide part 65 of the movable electrode 60. The silicide parts 55 and 65 are produced using tungsten or molybdenum that is the silicidizing metal having a high melting point and insoluble to the release etchant.

The MEMS device and the MEMS device fabrication method may include combinations of the first and second embodiments and the third and fourth embodiments.

Figure 8:
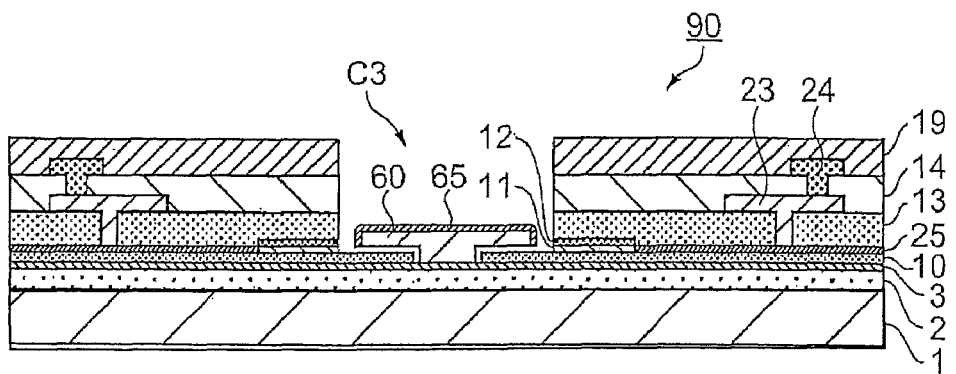
FIG. 8 is a schematic diagram explaining the structure of a MEMS device of a modified example of the invention.

FIG. 8 is a schematic sectional diagram to explain a MEMS device 90 having a composition combining the above embodiments. The elements of the MEMS device 90 of this modified example that are identical to those of the MEMS device in the previous embodiments are designated with the same reference numbers, and descriptions thereof will not be repeated.

With reference to FIG. 8, the MEMS device 90 includes: the silicon substrate 1, the fixed electrode 10 fixed on the silicon substrate 1, and the wiring layered part layered above the fixed electrode 10 and composed of the first interlayer insulating film 13, the first wiring layer 23, the second interlayer insulating film 14, the second wiring layer 24, and the protection film 19. Also, the movable electrode 60 is provided in a movable manner in an opening C3 that is a space made in the approximate center of the wiring layered part. The surface of the portion covered by the wiring layered part of the fixed electrode 10 includes the silicide part 25 provided by silicidization. Also, the surface of the movable electrode 60 includes the silicide part 65 provided by silicidization.

Layered on the silicon substrate 1 are the insulating film 2 and the nitride film 3, in this order. On the nitride film 3, the fixed electrode 10 is formed by depositing ion-implanting impurity ions to, and patterning, the polycrystalline silicon film. The fixed electrode 10 includes: a portion exposed to the opening C3, a portion including the sacrificial layer 11 and the interlayer film 12 layered in this order and covering a predetermined area from the opening C3, and the silicide part 25 that is silicidized with a silicidizing metal.

As described, because the fixed electrode 10 is implanted with impurity ions and the portion thereof is silicidized to provide the silicide part 25, the sheet resistance value is drastically reduced.

Also, the silicide part 25 of the fixed electrode 10 is formed at the portion covered by the wiring layered part. In other words, the silicide part 25 of the fixed electrode 10 is formed in a region unexposed to the release etchant used in the process of releasing the movable electrode 60. Accordingly, there is no need to consider the anti-corrosion property of the silicidizing metal against the release etchant when selecting the metal. Thus, the silicidizing metal may be an inexpensive metal, for example, and that may help cut the production costs.

The movable electrode 60 at the recessed bottom of the opening C3 made in the approximate center of the wiring layered part is formed by implanting impurity ions to the polycrystalline silicon film and then patterning. Also, the surface of the movable electrode 60 includes the silicide part 65 that is silicidized with a silicidizing metal made of a metal having a high melting point, such as tungsten or molybdenum.

As described, because the silicide part 65 is silicidized with tungsten or molybdenum after the impurity-ion implantation, the sheet resistance is drastically reduced.

Also, because tungsten or molybdenum used as the silicidizing metal is insoluble particularly to the hydrofluoric etchant used in the process of releasing the movable electrode 60, it is possible to avoid a problem such that the sheet resistance of the movable electrode 60 increases due to dissolution of the portion of the silicide part in the release etchant.

The embodiments and their modified example of the invention are hereinbefore described. However, the invention is not limited to these embodiments and further modifications may be made without departing from the scope of the invention.

For example, in the embodiments above, a base of the movable electrode and the fixed electrode as the MEMS structures of the MEMS device are fabricated by patterning polycrystalline silicon. However, the base of the MEMS structures may be fabricated using amorphous silicon.

A MEMS structure fabricated with amorphous silicon does not have orderly crystal alignment as does the crystalline silicon. Therefore, it is possible to suppress metal fatigue along the crystal grain boundary particularly when the movable electrode is continuously operated. Also, amorphous silicon can be used as a material of, for example, gate electrodes of transistors and can be produced at a relatively low temperature. Thus, amorphous silicon enables fabrication of a high-performance MEMS device combined with CMOS using the common semiconductor fabrication processes.

Also, in the fabrication of each of the fixed electrode and the movable electrode in the embodiments, polycrystalline silicon that is the base of the fixed electrode and the movable electrode is deposited and then implanted with impurity ions. However, the impurity ion implantation may be conducted in either the process of fabricating the fixed electrode or the process of fabricating the movable electrode to either the fixed electrode or the movable electrode in order to produce the effect of reducing the resistance of the entire circuitry of the MEMS device.

What is claimed is:

1. A micro electro mechanical system device comprising:
   a substrate;
   a fixed electrode formed above the substrate, the fixed electrode including poly-silicon which contains impurities;
   a movable electrode formed above the substrate, the movable electrode including poly-silicon which contains impurities;
   a first insulating layer formed above the fixed electrode, the first insulating layer having a first opening;
   a silicide layer formed on a first part of the fixed electrode; and
   a first wiring layer connecting to the silicide layer,
   wherein the movable electrode is formed in the first opening of the first insulating layer and is spaced apart from the first insulating layer in a cross sectional view; and
   wherein the silicide layer is not formed on an entire upper surface of the fixed electrode.

2. The device according to claim 1, wherein the movable electrode has a T-shaped structure in a cross-sectional view.

3. The device according to claim 1, wherein the movable electrode has a comb shape in a plan view.

4. The device according to claim 1, further comprising an open cavity above the fixed electrode.

5. The device according to claim 1, wherein the silicide layer includes tungsten or molybdenum.

6. The device according to claim 1, wherein a second part of the fixed electrode is formed in the opening.

7. A micro electro mechanical system device comprising:
   a substrate;
   a fixed electrode formed above the substrate, the fixed electrode including poly-silicon which contains impurities;
   a movable electrode formed above the substrate, the movable electrode including poly-silicon which contains impurities;
   a first insulating layer formed above the fixed electrode, the first insulating layer having a first opening;
   a silicide layer formed on a first part of the fixed electrode;
   a first wiring layer connecting to the silicide layer;
   a second insulating layer formed above the first insulating layer, the second insulating layer having a second opening; and
   a second wiring layer connecting to the first wiring layer,
   wherein the movable electrode is formed in the first opening of the first insulating layer and is spaced apart from the first insulating layer in a cross sectional view; and
   wherein a portion of the first wiring layer penetrates the first insulating layer, a portion of the second wiring layer penetrates the second insulating layer, and the second opening is located above the fixed electrode.

8. The micro electro mechanical system device of claim 7, wherein the movable electrode is formed in the first opening of the first insulating layer and is spaced apart from the first insulating layer in a cross sectional view.

9. The device according to claim 7, wherein the silicide layer is not formed on an entire upper surface of the fixed electrode.

10. The device according to claim 7, wherein the movable electrode has a T-shaped structure in a cross-sectional view.

11. The device according to claim 7, wherein the movable electrode has a comb shape in a plan view.

12. The device according to claim 7, further comprising an open cavity above the fixed electrode.

13. The device according to claim 7, wherein the silicide layer includes tungsten or molybdenum.

14. The device according to claim 7, wherein a second part of the fixed electrode is formed in the opening.

\* \* \* \* \*